United States Patent [19]

Asami

[11] Patent Number: 5,438,547
[45] Date of Patent: Aug. 1, 1995

[54] MEMORY-UNIT SENSE AMPLIFIER

[75] Inventor: Kazuo Asami, Itami, Japan

[73] Assignee: Mitsubishi Denki Kabushiki Kaisha, Tokyo, Japan

[21] Appl. No.: 283,506

[22] Filed: Aug. 1, 1994

[30] Foreign Application Priority Data

Aug. 2, 1993 [JP] Japan .................. 5-191131

[51] Int. Cl.⁶ .............................. G11C 7/06
[52] U.S. Cl. .................. 365/207; 365/206; 365/208; 327/51; 327/52; 327/545; 327/546
[58] Field of Search .............. 365/206, 207, 208; 327/51, 52, 545, 546

[56] References Cited

U.S. PATENT DOCUMENTS

| | | | |
|---|---|---|---|
| 4,916,665 | 4/1990 | Atsumi et al. | 327/51 |
| 5,197,028 | 3/1993 | Nakai | 365/208 |
| 5,276,369 | 1/1994 | Hayakawa et al. | 327/51 |

FOREIGN PATENT DOCUMENTS 0520357 6/1992 European Pat. Off. .

OTHER PUBLICATIONS

Nekkei Electronics, Sep. 22, 1986, (No. 404) pp. 133-144.

Primary Examiner—David C. Nelms
Assistant Examiner—Tan Nguyen
Attorney, Agent, or Firm—Leydig, Voit & Mayer

[57] ABSTRACT

In a memory unit having a sense amplifier for reading data, the dependence of the memory cell current detection level of the sense amplifier on the power source voltage is restrained. A memory-unit sense amplifier includes a bias circuit (20, 21, 22) for generating an output which mitigates fluctuations in the power source voltage VDD; and a detection result output section (10, 15) which outputs a memory cell current detection result obtained for the purpose of obtaining the value of memory cell data and which has a Pch (P-channel transistor), to the gate of which the output of the bias circuit (20, 21, 22) is connected, whereby fluctuations in the source/gate voltage of the Pch 10 are mitigated so as to restrain the dependence of the memory cell current detection level on the power source voltage.

8 Claims, 11 Drawing Sheets

FIG. 11
(WHEN THERE IS NO CELL CURRENT)

MEMORY-UNIT SENSE AMPLIFIER

BACKGROUND OF THE INVENTION

1. Field of the Invention

This invention relates to a memory-unit sense amplifier for memory for reading data from EEPROM or the like.

2. Description of the Related Art

Figure 7:
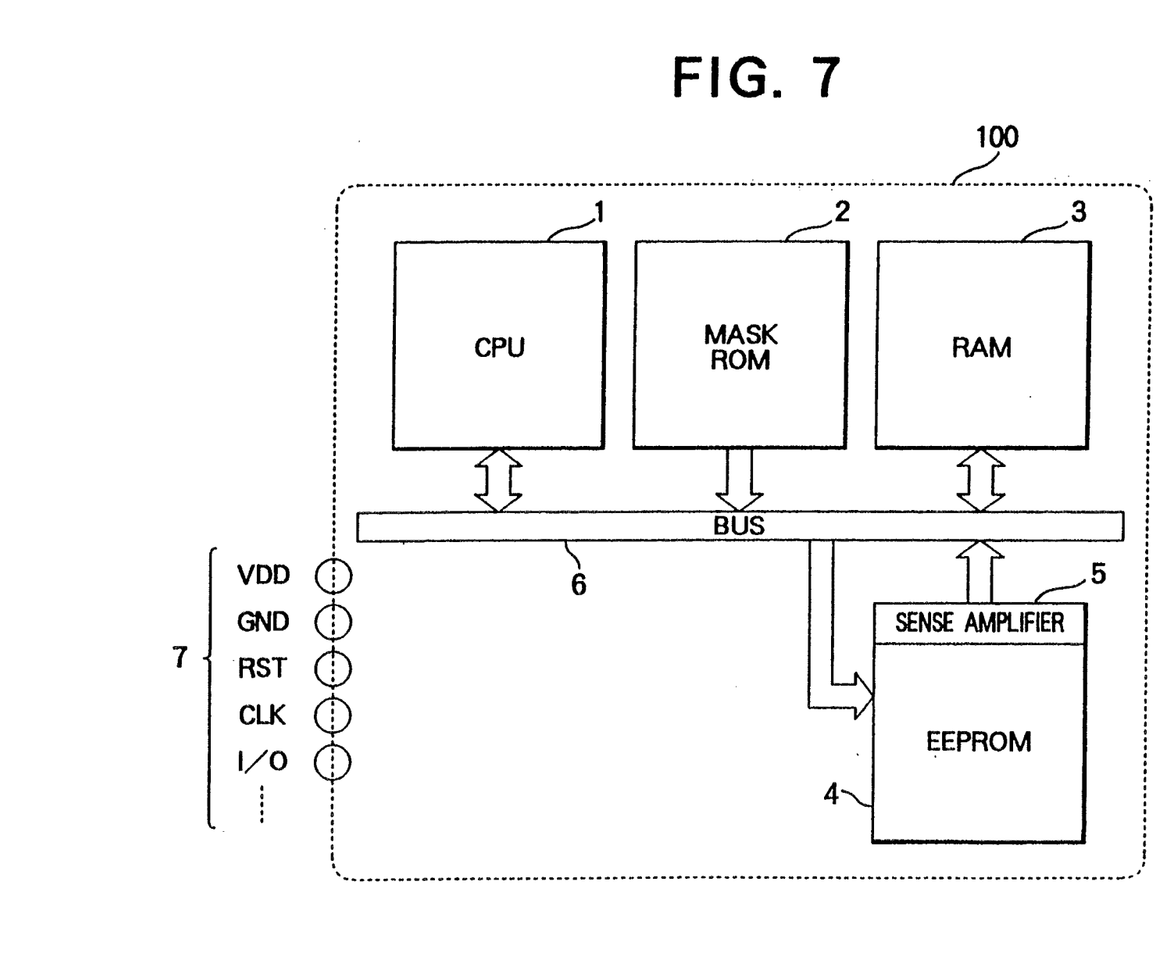
FIG. 7 is a functional block diagram showing a microcomputer containing an EEPROM as a memory unit including a sense amplifier.

FIG. 7 is a functional block diagram showing a microcomputer containing an EEPROM as a memory including a sense amplifier. In the drawing, numeral 100 indicates a microcomputer; numeral 1 indicates a CPU; numeral 2 indicates a mask ROM; numeral 3 indicates a RAM; numeral 4 indicates an EEPROM; numeral 5 indicates a sense amplifier of the EEPROM 4; numeral 6 indicates a bus; a numeral 7 indicates a terminal group comprising a power source terminal VDD, a ground terminal GND, a reset terminal RST, a clock terminal CLK, input/output terminal I/O, etc.

Figure 8:
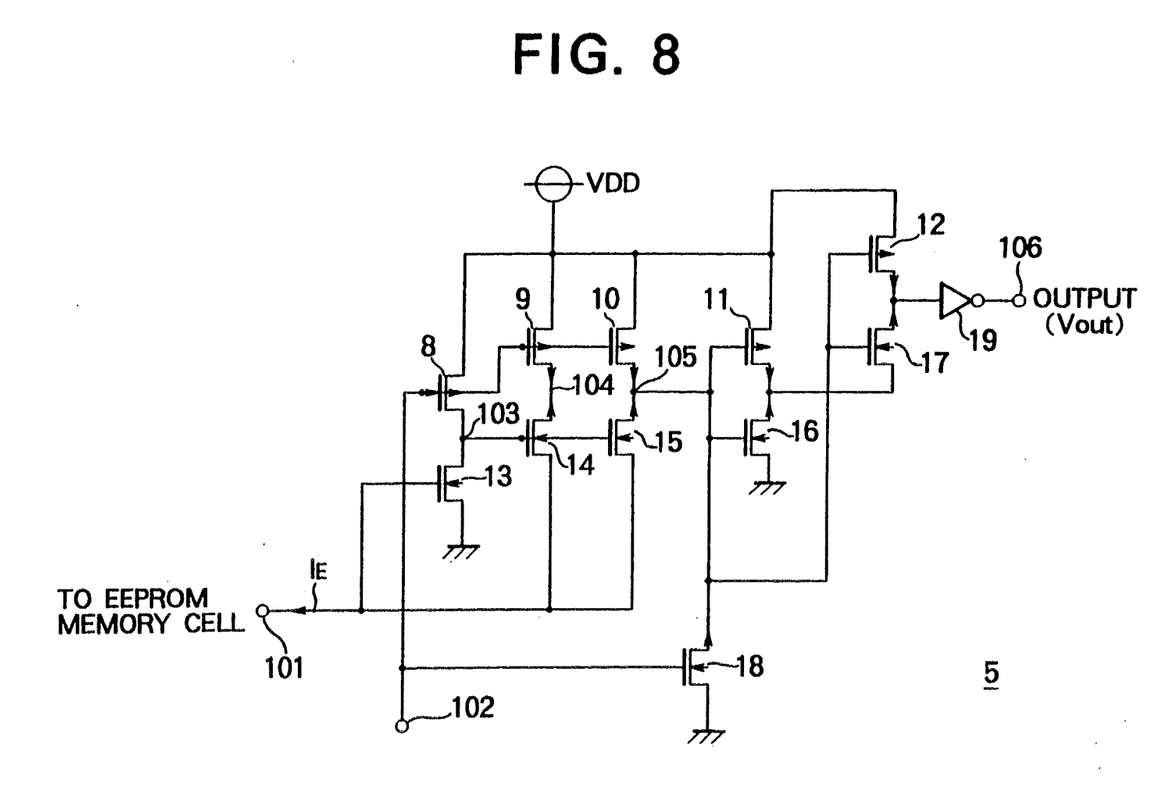
FIG. 8 is a circuit diagram showing a conventional sense amplifier.

FIG. 8 is a circuit diagram showing a conventional sense amplifier. In the drawing, numerals 8, 9, 10, 11 and 12 indicate P-channel transistors (hereinafter referred to as "Pch"); and numerals 13, 14, 15, 16, 17 and 18 indicate N-channel transistors (hereinafter referred to as "Nch"). These transistors consist of MOSFETs. Numeral 19 indicates an inverter. Numerals 101 through 106 indicate signals, wirings, terminals, etc. in different parts of the circuit, of which numeral 101 indicates a wiring leading to a EEPROM memory cell; numeral 102 indicates a signal line which is set to "L" level when data is being read out; and numeral 106 indicates a terminal generating the output of this sense amplifier. Symbol VDD indicates a power source voltage.

Figure 9:
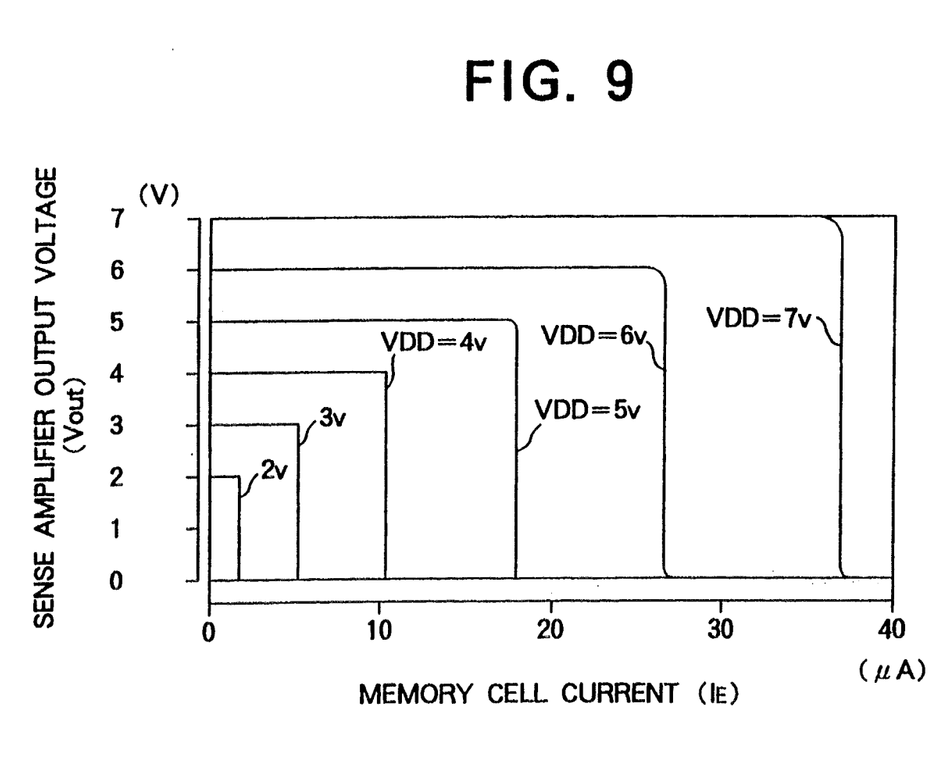
FIG. 9 is a chart showing the input/output characteristics of the conventional sense amplifier of FIG. 8.

FIG. 9 is a diagram showing the input/output characteristics of the conventional sense amplifier. The horizontal axis indicates memory cell current IE; and the vertical axis indicates output voltage Vout output from the output terminal 106.

Figure 10:
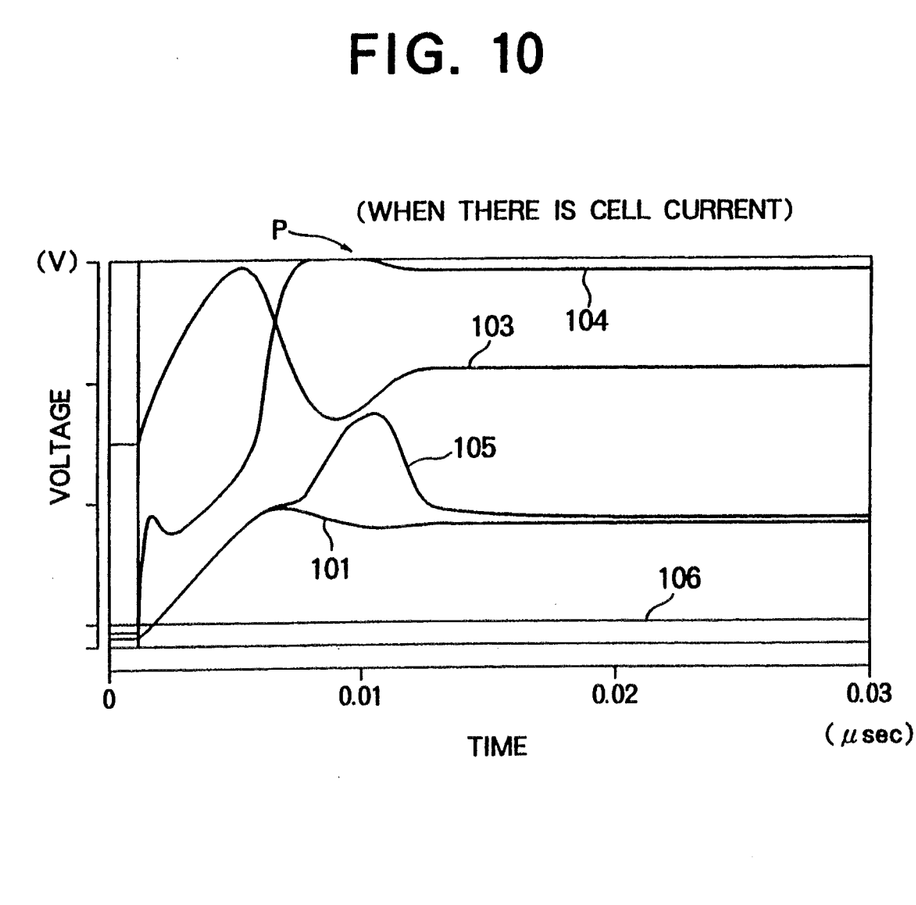
FIG. 10 is a diagram showing circuit simulation results obtained with respect to the sense amplifier of FIG. 8 when there is a memory cell current.
Figure 11:
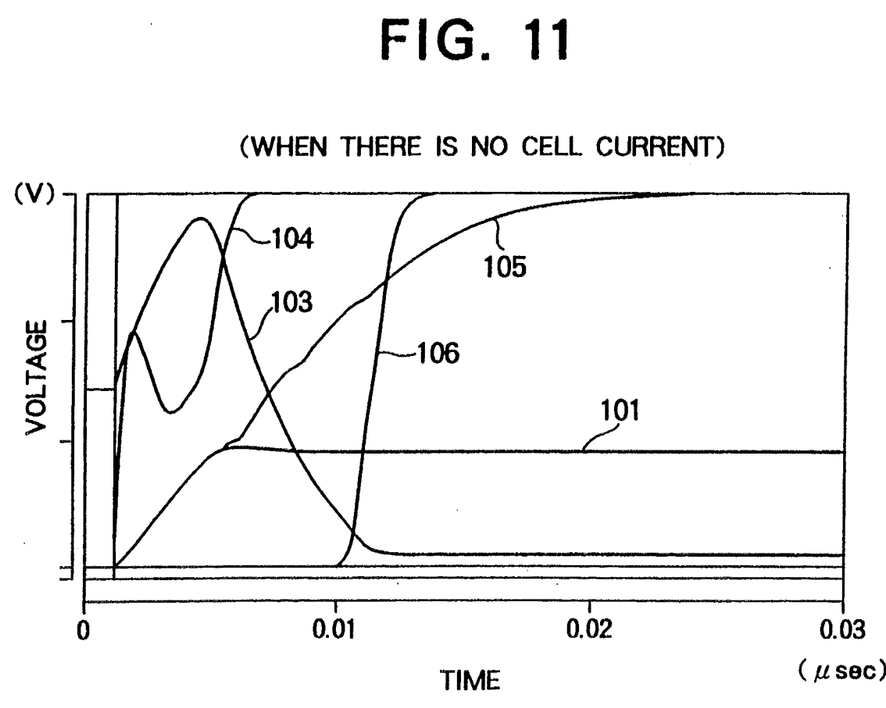
FIG. 11 is a diagram showing circuit simulation results obtained with respect to the sense amplifier of FIG. 8 when there is no memory cell current.

FIGS. 10 and 11 are diagrams showing simulation results obtained with this sense amplifier, of which FIG. 10 shows signal changes in different parts of the circuit shown in FIG. 8 when there is a memory cell current IE, and FIG. 11 shows signal changes in these parts when there is no memory cell current IE. The horizontal axis indicates time, and the vertical axis indicates voltage.

Next, the operation of this prior-art example will be described. First, the basic operation of the microcomputer 100 with a built-in EEPROM will be described with reference to FIG. 7. The mask ROM 2 stores user programs for executing various functions necessary in using the microcomputer. The terminal group 7, comprising VDD, GND, RST, CLK, I/O, etc., is provided as terminals for connection to external apparatus. First, upon receiving a reset signal from the terminal RST, the CPU 1 executes a branch routine stored beforehand at a predetermined address in the ROM 2. In the branch routine, branch to a user mode is effected when an user mode execution command is received. In the user mode operation, data input from outside through the I/O terminal is received by the CPU 1 through the bus 6. The CPU 1 performs data processing in accordance with a user program stored in the mask ROM 2. Data needing temporary storage is stored in the RAM 3, and data needing constant storage, such as processing results, is stored in the EEPROM 4 serving as a data memory. The data stored in the EEPROM 4 is read out through the sense amplifier 5. Any data output to the exterior is outwardly transferred through the I/O terminal, etc.

Next, the operation of the conventional sense amplifier will be described with reference FIGS. 8, 10 and 11.

First, the case shown in FIG. 10, in which there is a memory cell current IE (the case in which the value of the memory cell data is at L level), will be described. When data in the EEPROM is read, an L-level input signal 102 is input to the gates of the Pch 8, 9 and 10 to cause the Pch 8, 9 and 10 to turn on, and the signal 103 attains H level. Then, the Nch 14 and 15 turn on, and a current starts to flow from the power source voltage VDD toward the memory cell through the wiring portions 104 and 105 to perform parasitic capacity charging on the wiring 101, which is connected to the bit line of the memory cell. At the same time, due to the presence of the memory cell current, the memory transistors (not shown) conduct. As a result, the gate of the Nch 13 is not charged, so that the Nch 13 does not turn on completely. Therefore, although the potential of the signal 103 becomes somewhat lower than that of the VDD, the Nch 14 and 15 do not turn off. Thus, the voltage of the signal 105 does not increase, and the Pch 11 and 12 turn on, the inverter 19 causing the output signal 106 to be at L level.

Next, the case shown in FIG. 11, where there is no memory cell current IE (the case where the value of the memory cell data is at H level), will be described. When data in the EEPROM is read out, an L-level input signal 102 is input to the gates of the Pch 8, 9 and 10 to cause the Pch 8, 9 and 10 to turn on, and the signal 103 attains H level. Then, the Nch 14 and 15 turn on, and a current starts to flow from the VDD toward the memory cell through the wiring portions 104 and 105 to perform parasitic capacity charging on the wiring 101. Further, due to the absence of a memory cell current, the memory transistors (not shown) are out of conduction. Thus, when the parasitic capacity charging has been completed, the gate of the Nch 13 is charged. Then, the Nch 13 turns on, and the voltage of the signal 103 is lowered to cause the Nch 14 and 15 to turn off. Thus, the voltage of the signal 105 is raised by the charging to cause the Nch 16 and 17 to turn on, and the inverter signal 19 causes an H level output signal 106 to be output. The Nch 18 is ON except when data is being read out, thereby keeping the signal 105 pulled down to L level.

In the conventional memory sense amplifier, constructed as described above, the memory cell current detection level of the sense amplifier is determined by the source/gate voltage of the Pch 10 (one of the transistors in the detection result output section), so that any fluctuations in the power source voltage VDD cause the source/gate voltage of the Pch to fluctuate correspondingly, resulting in great fluctuations being caused in the memory cell current detection level depending on the power source voltage, as shown in FIG. 9. The "memory cell current detection level" means the value of the memory cell current IE when the sense amplifier output Vout suddenly changes from the power source voltage level to the ground level. As shown in the drawing, this value increases as the power source voltage VDD increases.

SUMMARY OF THE INVENTION

This invention has been made with a view toward solving the above problem. It is accordingly an object of this invention to provide a memory sense amplifier which restrains the dependence of the memory cell current detection level on the power source voltage so that it can operate in a more stable manner.

In order to achieve the above object, according to a first aspect of the present invention, there is provided a memory-unit sense amplifier for reading memory cell data, wherein the memory-unit sense amplifier includes: a detection result output section which outputs a detection result indicative of whether there is any memory cell current or not, detected for the purpose of obtaining the value of memory cell data, to an output amplifying section; and a bias circuit which supplies the gates of transistors in the detection result output section with an output which restrains fluctuations in the source/gate voltage of the transistors due to fluctuations in a power source voltage, whereby the dependence of the memory cell current detection level on the power source voltage is restrained.

According to a second aspect of the present invention, there is provided a memory-unit sense amplifier for reading memory cell data, comprising: a detection result output section which outputs a detection result indicative of whether there is any memory cell current or not, detected for the purpose of obtaining the value of memory cell data, to an output amplifying section and which has transistors; a current supplying section which performs wiring-parasitic-capacity charging and which checks whether memory transistors are conducting or not; and a bias circuit which supplies the gates of the transistors of the detection result output section and the gates of the transistors of the current supplying section with an output which restrains fluctuations of the source/gate voltage of these transistors due to fluctuations in power source voltage, wherein the dependence of the memory cell current detection level on the power source voltage is restrained, and, further, overshoot in the current supplying section is prevented.

In a third aspect of the present invention, there is provided, according to claim 1 or 2, a memory-unit sense amplifier, wherein the bias circuit further comprises a through-current preventing transistor which separates the bias circuit from the power source except when data is being read out so as to prevent a through-current from flowing through the bias circuit.

In a fourth aspect of the present invention, there is provided, according to one of claims 1, 2 and 3, a memory-unit sense amplifier further comprising a level maintaining section which maintains a signal transmission line for transmitting the detection result of the memory cell current detecting section for checking whether there is any memory cell current or not to the detection result output section at a predetermined value except when data is being read out, whereby the signal transmission line is prevented from being put into a floating condition to cause a through-current flow.

In the memory-unit sense amplifier according to the first aspect of the present invention, an output of the bias circuit which restrains fluctuations in the source/gate voltage of the transistors of the detection result output section due to fluctuations in the power source voltage, is connected to the gates of the transistors of the detection result output section for outputting the detection result as to whether there is any memory cell current or not, detected for the purpose of obtaining the value of memory cell data, to the output amplifying section, thereby restraining fluctuations in the memory cell current detection level.

In the memory-unit sense amplifier according to the second aspect of the present invention, the above-mentioned output of the bias circuit is also connected to the gates of the transistors in the current supplying section which supplies the memory cells with current for the purpose of detecting whether there is any memory cell current or not, performs wiring-parasitic-capacity charging and checks whether memory transistors are conducting or not, whereby the voltage-increase gradient in the section where the parasitic capacity charging is effected is kept constant, thereby preventing overshoot from being generated in the current supplying section.

In the memory-unit sense amplifier according to the third aspect of the present invention, the bias circuit further includes a through-current preventing transistor which separates the bias circuit from the power source except when data is being read out so as to prevent a through-current from flowing through the bias circuit, thereby attaining a reduction in power consumption.

In the memory-unit sense amplifier according to the fourth aspect of the present invention, there is further provided a level maintaining section for maintaining the signal transmission line, which transmits the detection result of the memory cell current detecting section for checking whether there is any memory cell current or not to the detection result output section, at a predetermined value except during operation, whereby the signal transmission line is prevented from being put into the floating state to cause a through-current flow, thereby attaining a reduction in power consumption.

DESCRIPTION OF THE PREFERRED EMBODIMENTS

The present invention will now be described with reference to the drawings.

First Embodiment

Figure 1:
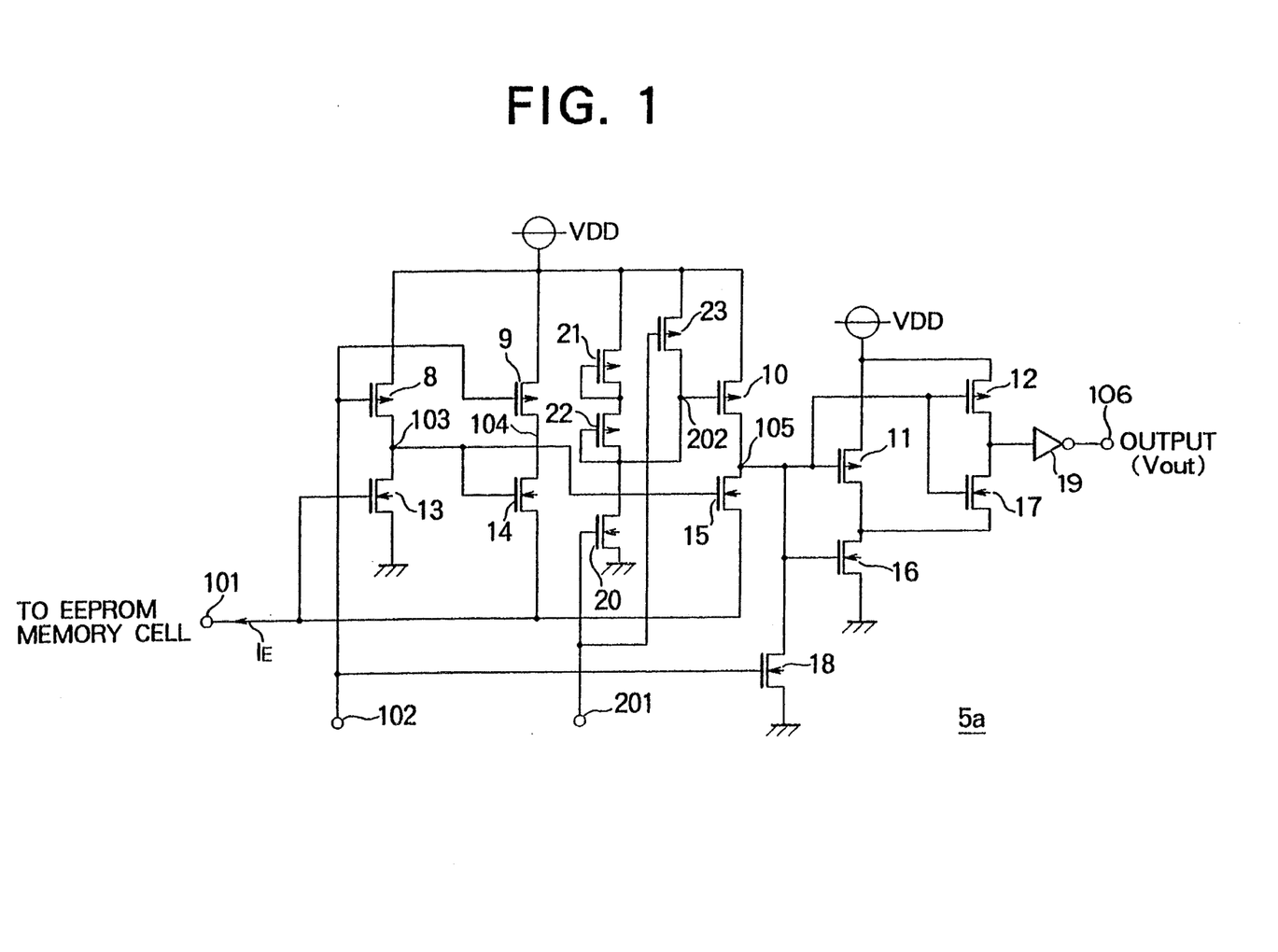
FIG. 1 is a circuit diagram showing a memory-unit sense amplifier according to a first embodiment of the present invention.

FIG. 1 is a circuit diagram showing a sense amplifier of a memory unit (EEPROM) according to a first embodiment of the present invention. In FIG. 1, numeral 5a indicates a sense amplifier; numerals 8, 9, 10, 11, 12 and 23 indicate Pch (P-channel transistors); numerals 13, 14, 15, 16, 17 and 18 indicate Nch (N-channel transistors); numeral 19 indicates an inverter; numeral 20 indicates an Nch having a small β (current amplification factor); and numerals 21 and 22 indicate diodes formed through diode connection of transistors having a large β. The series circuit composed of the diodes 21 and 22 and the Nch 20 provides a bias circuit which supplies the gate of the Pch 10 with an output which restrains fluctuations of the gate voltage of the Pch 10 due to fluctuations of the power source voltage VDD. Numerals 101 through 106 indicate signals, wirings, terminals, etc. in different parts, of which numeral 101 indicates a wiring leading to a memory cell; numeral 102 indicates a signal line which is at L level when data is being read out; and numeral 106 indicates the output terminal and output signal of this sense amplifier. Numeral 201 indicates a signal line which is constantly at H level; and numeral 202 indicates the output of the above-described bias circuit. Each of the above Pch and Nch transistors consists of a MOSFET.

Figure 2:
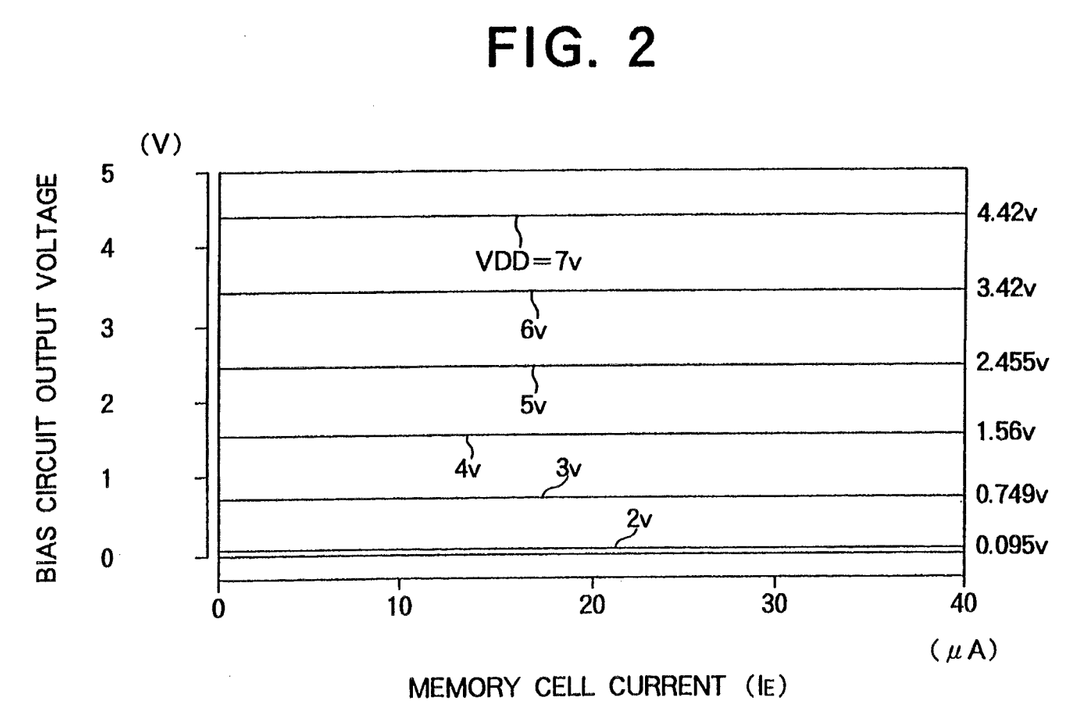
FIG. 2 is a chart illustrating the relationship between the power source voltage and the bias circuit output in the sense amplifier of FIG. 1.

FIG. 2 is a diagram showing the voltage of the output signal 202 of the bias circuit shown in FIG. 1. The horizontal axis indicates memory cell current IE, and the vertical axis indicates values of the voltage of the output signal 202 of the bias circuit with respect to different values of the power source voltage VDD. The values of the output signal 202 of the bias circuit shown in FIG. 2 are ones obtained when the Nch 20 has a channel length of 25 μm and a channel width of 2 μm, and the diodes 21 and 22 have a channel length of 1.5 μm and a channel width of 25 μm.

Figure 3:
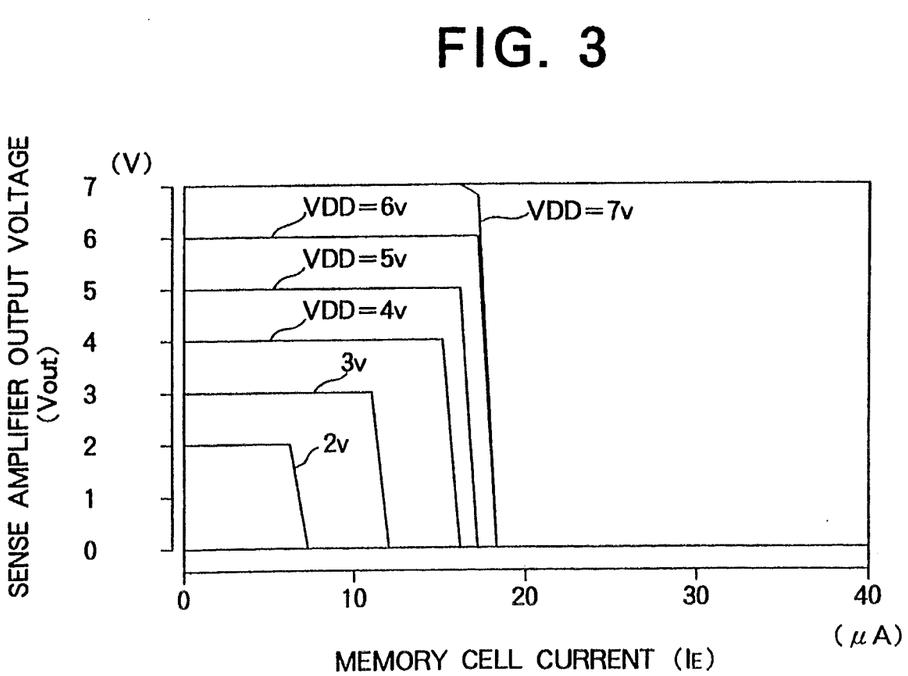
FIG. 3 is a chart showing the input/output characteristics of the sense amplifier of FIG. 1.

FIG. 3 is a diagram showing the input/output characteristics of the sense amplifier of FIG. 1. The horizontal axis indicates memory cell current IE, and the vertical axis indicates output voltage Vout from the output terminal 106.

The sense amplifier 5a of FIG. 1 comprises: a data detection circuit which is formed of the components indicated by numerals 8, 9, 10, 13, 14, 15, 18, 20, 21, 22 and 23; and an output amplifying circuit which is formed of the components indicated by numerals 11, 12, 16, 17 and 19 and which amplifies the output of the data detection circuit to convert it into a signal that is at either the power source voltage level or the ground level.

In the data detection circuit, the series circuit composed of the Pch 9 and the Nch 14 constitutes a current supplying section which supplies the memory cell with a current for the purpose of checking whether there is any memory cell current or not, which effects wiring-parasitic-capacity charging, and which checks whether the memory transistors (not shown) are conducting or not. The series circuit composed of the Pch 8 and the Nch 13 constitutes a memory cell current detecting section which checks whether there is any memory cell current or not on the basis of the current supply from the current supplying section (9, 14). The series circuit composed of the Pch 10 and the Nch 15 constitutes a detection result output section which outputs detection results in accordance with the detection result as to whether there is any memory cell current or not, obtained by the memory cell current detecting section (8, 13). Further, the wiring 103 provides a signal transmission wiring for transmitting the results obtained by the memory cell current detecting section (8, 13) to the detection result output section (10, 15). Further, the series circuit composed of the diodes 21 and 22 and the Nch 20, and the Pch 23 constitute a bias circuit for supplying the gates of the transistors of the detection result output section (10, 15) with a voltage in which the influence of fluctuations of the power source voltage has been mitigated. The Nch 18 provides an output maintaining section for maintaining, except during operation, the wiring 105, which connects the output of the detection result output section (10, 15) to the output amplifying section (11, 12, 16, 17 and 19), at a predetermined level (Thus, the output 106 of the output amplifying section is also maintained at a predetermined value).

Next, the operation of the sense amplifier of this invention will be described with reference to FIGS. 1 through 3. The operation of the microcomputer as a whole is the same as that in the prior art.

In this embodiment, the output of the bias circuit is supplied to the gate of the Pch 10, which is a transistor in the detection result output section for outputting the detection results as to the presence of a memory cell current, detected for the purpose of obtaining the memory cell data value, and the fluctuations of the source/gate voltage of the Pch 10 are diminished, thereby further restraining the fluctuations of the memory cell current detection level due to fluctuations in the power source voltage.

First, the case where there is a memory cell current IE (i.e., the case where the value of the memory cell data is at L level) will be described. When data in the EEPROM is read out, an L-level input signal 102 is input to the gates of the Pch transistors 8 and 9. An H-level signal is input to the gates of the Nch 20 and the Pch 23 from the terminal 201. By the input of the L-level signal 102 to the gates of the Pch transistors 8 and 9, these Pch transistors 8 and 9 turn on, and the signal line 103 attains H-level. Further, an H-level signal 201 is input to the gate of the Nch 20 to turn on the Nch 20, and, due to the diodes 21 and 22, the signal 202 when, for example, VDD=5 V, is 2.455 V (from FIG. 2), so that the Pch 10 turns on. Then, the Nch transistors 14 and 15 turn on, whereby a current starts to flow from the VDD toward the memory cell through the wiring portions 104 and 105, thereby effecting parasitic capacity charging on the wiring 101 and the bit line (not shown) of the EEPROM memory cell connected thereto. At the same time, due to the presence of the memory cell current IE, the memory transistor (not shown) conducts. As a result, the gate of the Nch 13 is not charged, so that the Nch 13 does not turn on completely. Therefore, the Nch transistors 14 and 15 do not turn off although the voltage of the signal 103 becomes somewhat lower than the VDD. Thus, the voltage of the signal 105 is not increased, and the Pch transistors 11 and 12 turn on, the inverter 19 causing an L-level output signal 106 to be output. Further, the Nch 18 is ON except when data is being read out so as to keep the signal 105 pulled down to L level, and the level of the output signal 106 is fixed.

Next, the case where there is no memory cell current (i.e., the case in which the value of the memory cell data is at H level) will be described. As in the above case, an L-level input signal 102 is input to the gates of the Pch 8 and 9, and an H-level input signal 201 is input to the gate of the Nch 20. Then, the Pch transistors 8 and 9 turn on to cause the signal 103 to attain H level. Further, the Nch 20 turns on, and, due to the diodes 21 and 22, the signal 202 when, for example, VDD=5 V, is 2.455 V, so that the Pch 10 turns on. Then, the Nch transistors 14 and 15 turn on, and a current starts to flow from the VDD toward the memory cell through the signal portions 104 and 105, thereby effecting parasitic capacity charging on the wiring 101, etc. Further, due to the absence of the memory cell current IE, the memory cell transistors are out of conduction. Thus, when the parasitic capacity charging has been completed, the gate of the Nch 13 is charged, whereby the Nch 13 turns on, and the voltage of the signal 103 is lowered and the Nch 14 and 15 turn off. As a result, the signal 105 is charged to undergo a reduction in voltage, and the Nch 16 and 17 turn on, an H-level output signal 106 being caused to be output by the inverter 19.

The above-described operation is substantially the same as that of the conventional circuit. In the conventional circuit, however, the source/gate voltage of the Pch 10, which is at VDD when data is being read out, fluctuates by the same amount as the VDD. In the sense amplifier 5a of this invention, the source/gate voltage when VDD=5 V is 2.545 V (5 V−2.455 V) and the source/gate voltage when VDD=3 V is 2.251 V (3 V−0.749 V), as shown in FIG. 2. That is, the difference in voltage between the VDD, which is the source/gate voltage of the Pch 10, and the signal 202 is small. That is, the fluctuations only occur to a relatively small degree. Accordingly, the fluctuation of the memory cell current detection level is small as shown in FIG. 3.

Thus, a sense amplifier which is relatively free from the influence of fluctuations in power source voltage and which, consequently, operates in a more stable manner is provided.

While the above embodiment has a bias circuit comprising two diodes, consisting of transistors in diode connection, and one Nch transistor, this should not be construed restrictively. Any type of bias circuit will do as long as it restrains the fluctuations of the source/gate voltage of the Pch 10 with respect to fluctuations in the power source voltage (a bias circuit supplying an output obtained through division of power source voltage).

Second Embodiment

Figure 4:
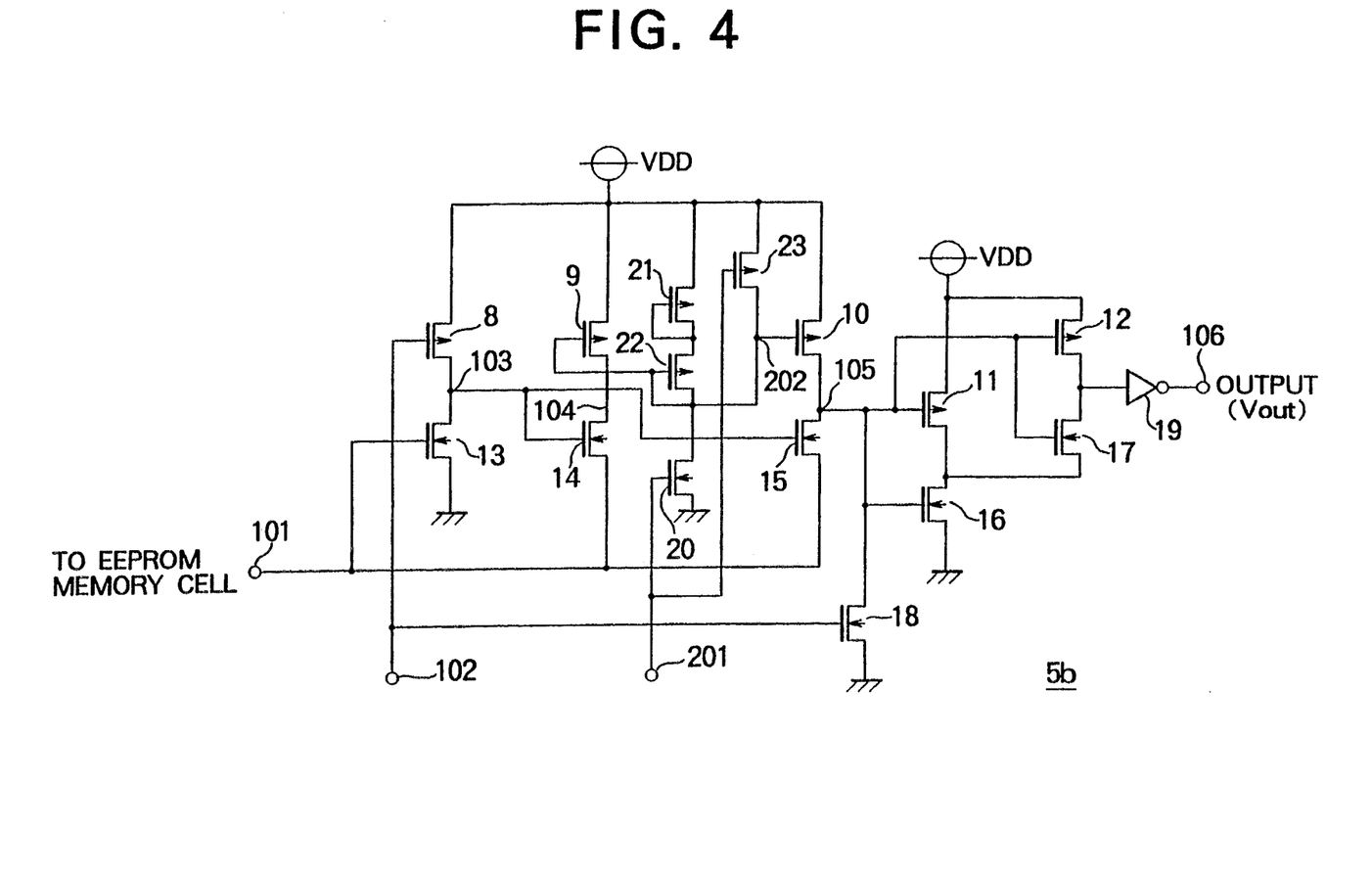
FIG. 4 is a circuit diagram showing a memory-unit sense amplifier according to another embodiment of the present invention.

FIG. 4 is a circuit diagram showing a memory-unit sense amplifier according to another embodiment of the present invention. The sense amplifier shown in FIG. 4 differs from the sense amplifier 5a of FIG. 1 in that the signal 202, which is the output of the bias circuit, is also connected to the gate of the Pch 9, which is a transistor in the current supply section for supplying the memory cell with a current, effecting parasitic capacity charging and checking whether the memory transistors are conducting or not.

Next, the operation of the sense amplifier 5b of this embodiment will be described. First, the case where there is a memory cell current (i.e., the case in which the value of the memory cell data is at L level) will be described. When data in the EEPROM is read out, an L-level input signal 102 is input to the gate of the Pch 8, and an H-level input signal 201 is input to the gate of the Nch 20. Then, the Pch 8 turns on and the signal 103 attains H level. Further, the Nch 20 turns on, and, due to the diodes 21 and 22, the signal 202 when, for example, VDD=5 V, is 2.455 V, and the Pch 9 and 10 turn on. Then, the Nch 14 and 15 turn on, and a current starts to flow from the VDD toward the memory cell through the wiring portions 104 and 105, whereby parasitic capacity charging is effected on the wiring 101 and the bit line (not shown) of the EEPROM memory cell connected thereto, and, due to the presence of the memory cell current, the memory transistors (not shown) conduct. As a result, the gate of the Nch 13 is not charged, so that the Nch 13 does not turn on completely. Therefore, although the signal 103 becomes somewhat lower in voltage than the VDD, the Nch transistors 14 and 15 do not turn off. Thus, the signal 105 does not increase in voltage, and the Pch 11 and 12 turn on, an L-level output signal 106 being caused to be output by the inverter 19. Further, since the signal 202 is input to the gate of the Pch 9, the gradient representing the increase in the voltage of the signal 104 is not caused to fluctuate by fluctuations of the VDD. Further, except when data is being read out, the Nch 18 turns on to pull the signal 105 down to L level, thereby maintaining the output signal 106 at the fixed level.

Next, the case where there is no memory cell current (i.e., the case where the value of the memory cell data is at H level) will be described. As in the above case, an L-level input signal 402 is input to the gate of the Pch 8, and an H-level input signal 201 is input to the gate of the Nch 20. Then, the Pch 8 turns on and the input signal 103 attains H level. Further, the Nch transistor 20 turns on, and, due to the diodes 21 and 22, the signal 202 when, for example, VDD=5 V, is 2.455 V, so that the Pch transistors 9 and 10 turn on. Then, the Nch transistors 14 and 15 turn on and a current starts to flow from the VDD toward the memory cell through the wiring portions 104 and 105, thereby effecting parasitic capacity charging on the wiring 101, etc. Further, due to the absence of memory cell current, the memory transistors (not shown) are out of conduction. Thus, when the parasitic capacity charging has been completed, the gate of the Nch 13 is charged. Then, the Nch 13 turns on to cause the voltage of the signal 102 to decrease, and the Nch transistors 14 and 15 turn off. As a result, the signal 105 is charged to increase in voltage, and the Nch transistors 16 and 17 turn on, an H-level output signal 106 being caused to be output by the inverter 19. Further, since the signal 202 is also input to the gate of the Pch 9, the voltage increase gradient of the signal 104 is not caused to fluctuate by fluctuations in the VDD.

Thus, in the sense amplifier of this embodiment, the fluctuations in the source/gate voltage of the Pch 9 due to fluctuations of the power source voltage are also restrained, so that the voltage increase gradient of the signal 104 is kept constant, thereby preventing overshoot, which would otherwise cause a malfunction, etc. by excessively increasing the current of the signal 104 (i.e., by causing a needless current flow), as indicated at P in FIG. 10 illustrating the prior art.

Third Embodiment

Figure 5:
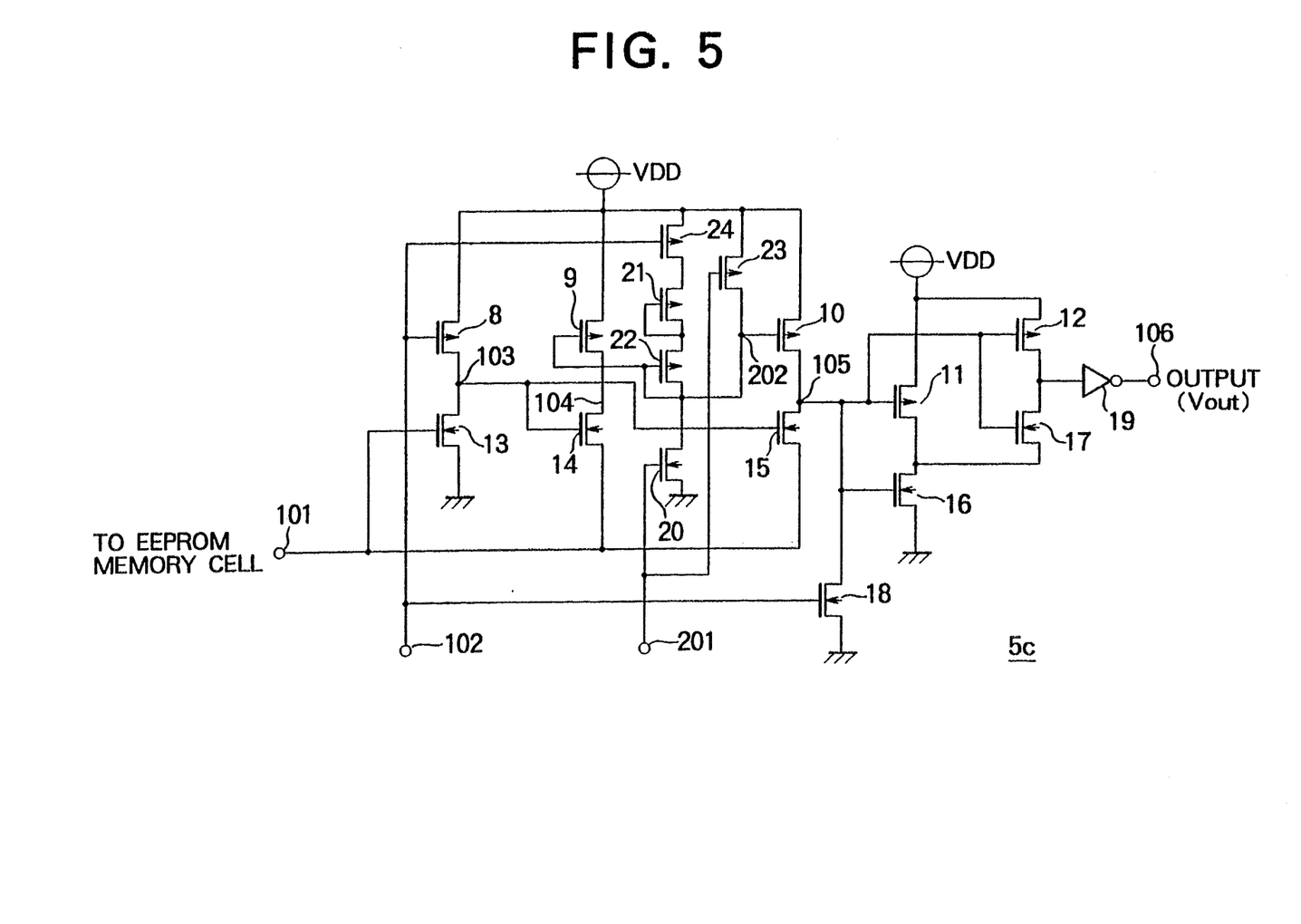
FIG. 5 is a circuit diagram showing a memory-unit sense amplifier according to still another embodiment of the present invention.

FIG. 5 is a circuit diagram showing a memory-unit sense amplifier according to still another embodiment of the present invention. The sense amplifier shown in FIG. 5 differs from that of the second embodiment of FIG. 4 in that a Pch 24 is provided between the diode 21 of the bias circuit, which is composed of the diodes 21 and 22 and the Nch 20, and the power source VDD. The Pch 24 is provided as a through-current preventing transistor for separating the bias circuit from the power source VDD except when data is being read out so as to prevent a through-current from flowing through the bias circuit. The signal 102 is input to the gate of the Pch 24.

Next, the operation of this embodiment will be described. Since an H-level signal 201 is always input to the gate of the Nch 20 of the bias circuit, a through-current is allowed to flow through the bias circuit, which is connected between the VDD and the ground. In view of this, in the sense amplifier 5c of this embodiment, a Pch 24 to whose gate is input a signal 102 which is at L level only when data is being read out is provided in series in the bias circuit. Thus, the Pch 24 is off except when data is being read out, that is, due to the Pch 24, the bias circuit is separated from the VDD except when data is being read out, whereby a through-current is prevented from flowing through the bias circuit, thereby attaining a reduction in power consumption. Apart from the above, the operation of this embodiment is basically the same as that of the second embodiment, so a further description thereof will be omitted.

Fourth Embodiment

Figure 6:
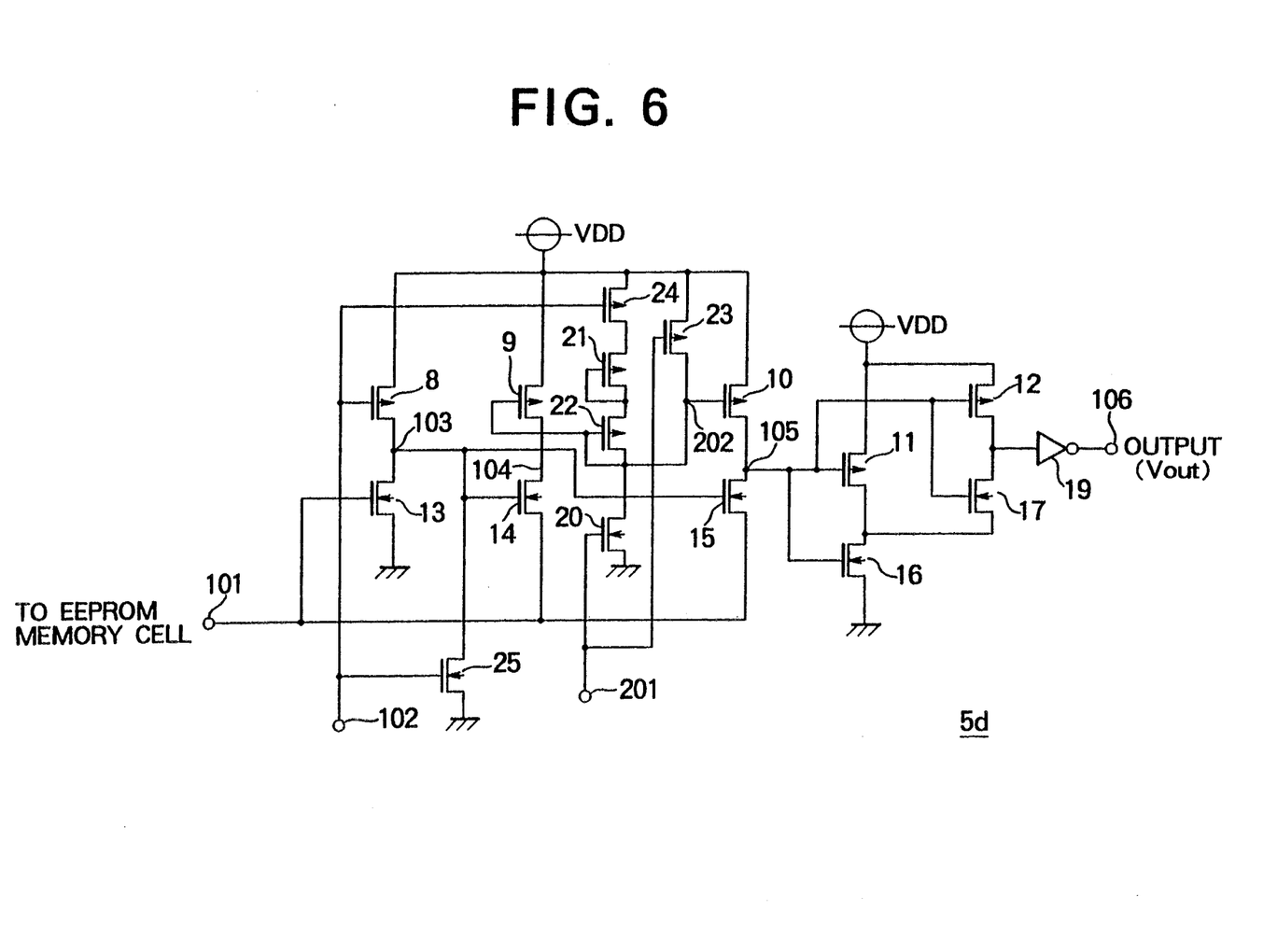
FIG. 6 is a circuit diagram showing a memory-unit sense amplifier according to yet another embodiment of the present invention.

FIG. 6 is a circuit diagram showing a sense amplifier according to yet another embodiment of the present invention. Since the Nch 18, which pulls down the signal 105 in the above embodiments, turns on except when data is being read out, a through-current flows from the VDD to the GND through the circuit composed of the Pch 10 and the Nch 18. Further, in some cases, the signal 103 is put into a floating state, when a through-current may be allowed to flow. In view of this, in the sense amplifier 5d of this embodiment, the Nch 18 is eliminated and, at the same time, an Nch 25 is provided which serves to keep the signal 103 pulled down to L level except when data is being read out. The signal 102 is input to the gate of the Nch 25. Apart from the above, the circuit of this embodiment is the same as that of the third embodiment shown in FIG. 5. The signal line 103 serves as a signal transmission wiring for transmitting the detection result of the memory cell current detecting section for checking whether there is any memory cell current or not to the detection result output section, and the Nch 25 serves as a level maintaining section for maintaining this signal transmission wiring at a predetermined level except when data is being read out.

Next, the operation of this embodiment will be described. Due to the H-level signal 102 input to the gate of the Nch 25, the Nch 25 is ON except when data is being read out, thereby maintaining the signal 103 in the pulled-down state. Thus, it is possible to prevent a through-current which would otherwise flow through the series circuit of the Pch 9 and the Nch 14 and through the series circuit of the Pch 10 and the Nch 15 when the signal 103 is put into the floating state. When a data reading operation is started, an L-level signal 102 is input to the gate of the Nch 25, so that it turns off. Thus, it does not affect the reading operation. Further, due to the elimination of the Nch 18, it is possible to prevent the through-current which would otherwise be allowed to flow through the Nch 18 except during data reading operation. Apart from the above, the operation of this embodiment is basically the same as that of the other embodiments, so a further description thereof will be omitted.

As described above, in the memory-unit sense amplifier according to the first aspect of the present invention, there is provided a bias circuit for generating an output in which fluctuations in the power source voltage have been mitigated, and this output of the bias circuit is supplied to the gates of transistors in a detection result output section for outputting a detection result indicative of whether there is any memory cell current or not, detected for the purpose of obtaining the value of memory cell data, to an output amplifying section, thereby restraining fluctuations in the source/gate voltage of the above-mentioned transistors. Due to this arrangement, fluctuations in the memory cell current detection level are restrained, whereby it is possible to provide a sense amplifier which is relatively free from the influence of fluctuations in power source voltage and which operates in a more stable manner.

In a memory-unit sense amplifier according to the second aspect of the present invention, the output of the above-mentioned bias circuit is also connected to the gates of transistors in a current supply section which, in order to check whether there is any memory cell current or not, supplies the memory cell with a current, which effects wiring-parasitic-capacity charging and which checks whether memory cell transistors are conducting or not, whereby the voltage increase gradient when the parasitic capacity charging is effected can be kept constant, thereby making it possible to provide a highly reliable sense amplifier in which overshoot is prevented from being generated in this current supply section.

In a memory-unit sense amplifier according to the third aspect of the present invention, the above-mentioned bias circuit of the sense amplifier is provided with a through-current preventing transistor which separates the bias circuit from the power source except when data is being read out, so that a through-current is prevented from flowing through the bias circuit except when data is being read out, thereby making it possible to provide a sense amplifier in which a further reduction in power consumption can be attained.

In a memory-unit sense amplifier according to the fourth aspect of the present invention, there is further provided a level maintaining section which keeps a signal transmission wiring for transmitting the detection result of the memory cell current detecting section, which checks whether there is any memory cell current or not, at a predetermined value except when data is being read out, so that the above-mentioned signal transmission wiring is prevented from being put into a floating state to cause a through-current flow, whereby it is possible to provide a sense amplifier in which a further reduction in power consumption can be attained.

What is claimed is:

1. A memory-unit sense amplifier for reading memory cell data, comprising:

a current supplying section which has transistors connected to a power source and which, in order to obtain the value of memory cell data, supplies the memory cell with a current so as to check whether there is any memory cell current or not;

a memory cell current detecting section for checking whether there is any memory cell current or not on the basis of the current supply from said current supplying section;

a detection result output section which includes transistors connected to the power source and which outputs a detection result in accordance with the result obtained by said memory cell current detecting section;

a first signal transmission wiring for transmitting the detection result obtained by said memory cell current detecting section to said detection result output section; and a bias circuit section for supplying the gates of the transistors of said detection result output section with an output which restrains fluctuations in the source/gate voltage of the transistors due to fluctuations in the power source voltage, wherein the dependence of the memory cell current detection level on the power source voltage is restrained.

2. A memory-unit sense amplifier according to claim 1 wherein said bias circuit section further includes a through-current preventing device which separates said bias circuit section from the power source except when data is being read out, thereby preventing a through-current from flowing through said bias circuit section.

3. A memory-unit sense amplifier according to claim 1 further comprising a level maintaining section which maintains said first signal transmission wiring, which transmits the result obtained by said memory cell current detecting section to said detection result output section, at a predetermined value except when data is being read out, to prevent said first signal transmission wiring from being put into a floating state to thereby cause a through-current flow.

4. A memory-unit sense amplifier according to claim 1 wherein said output of said bias circuit section, which restrains fluctuations in the source/gate voltage of the transistors due to fluctuations in the power source voltage, is further connected to the gates of the transistors of said current supplying section so as to prevent overshoot in said current supplying section.

5. A memory-unit sense amplifier according to claim 4 wherein said bias circuit section further includes a through-current preventing device which separates said bias circuit section from the power source except when data is being read out, thereby preventing a through-current from flowing through said bias circuit section.

6. A memory-unit sense amplifier according to claim 4 further comprising a level maintaining section which maintains said first signal transmission wiring, which transmits the result obtained by said memory cell current detecting section to said detection result output section, at a predetermined value except when data is being read out, thereby preventing said first signal transmission wiring from being put into a floating state to thereby cause a through-current flow.

7. A circuit for use in a memory-unit having a memory cell, the circuit comprising a sense amplifier for reading the memory cell including a bias circuit, the bias circuit including first and second diode connected transistors coupled in series with a third transistor, the first and second diode connected transistors having a larger current amplification factor than the third transistor, an output of the bias circuit restraining fluctuations of a current detection level due to fluctuations in a power source voltage.

8. The circuit of claim 7 including a fourth transistor outputting a detection result indicative of a memory cell current in the memory cell, the fourth transistor being coupled to the power source voltage and having a base receiving the output of the bias circuit.

* * * * *